(12) United States Patent
Zhang et al.

(10) Patent No.: US 12,739,997 B2
(45) Date of Patent: Sep. 15, 2026

(54) POWER BOOST AND CONVERSION SYSTEM

(71) Applicant: Zhejiang Jinko Energy Storage Co., Ltd., Haining City (CN)

(72) Inventors: Luhua Zhang, Haining City (CN); Guodong Xu, Haining City (CN)

(73) Assignee: Zhejiang Jinko Energy Storage Co., Ltd., Haining (CN)

( * ) Notice: Subject to any disclaimer, the term of this patent is extended or adjusted under 35 U.S.C. 154(b) by 138 days.

(21) Appl. No.: 18/964,248

(22) Filed: Nov. 29, 2024

(65) Prior Publication Data

US 2025/0098096 A1 Mar. 20, 2025

(30) Foreign Application Priority Data

Oct. 21, 2024 (CN) ........................ 202411471457.0

(51) Int. Cl.
*G06F 1/16* (2006.01)
*H02M 7/00* (2006.01)
(Continued)

(52) U.S. Cl.
CPC .............. *H05K 7/14* (2013.01); *H02M 7/003* (2013.01); *H05K 7/18* (2013.01)

(58) Field of Classification Search
CPC ........... H02M 7/003; H05K 7/18; H05K 7/14; H05K 7/1432; H05K 7/14322; H05K 7/14329
See application file for complete search history.

(56) References Cited

U.S. PATENT DOCUMENTS 6,040,976 A * 3/2000 Bruner ..................... H02B 1/21 439/212
6,111,745 A * 8/2000 Wilkie ..................... H02B 1/21 174/68.2
(Continued)

FOREIGN PATENT DOCUMENTS

CN 108347077 A 7/2018
CN 210120207 U 2/2020
(Continued)

OTHER PUBLICATIONS

Zhejiang Jinko Energy Storage Co., Ltd., Eurpoean Search Report, EP 24216387.1, May 15, 2025, 9 pgs.

*Primary Examiner* — Anthony M Haughton
(74) *Attorney, Agent, or Firm* — USCH Law, PC

(57) ABSTRACT

Embodiments of the present disclosure relate to the field of energy storage and provide a power boost and conversion system, including: a cabinet including a control portion, a conversion portion, and a partition plate arranged between the control portion and the conversion portion. The control portion is configured to accommodate a control circuit, and the conversion portion is configured to accommodate a first converter and a second converter. The control circuit includes a first circuit breaker, a second circuit breaker, a first fuse, a second fuse, a first relay, a second relay, a third relay, and a fourth relay. The first circuit breaker is arranged above the second circuit breaker by means of a first frame, and the first fuse and the second fuse are arranged above the first relay, the second relay, the third relay, and the fourth relay by means of a second frame.

20 Claims, 6 Drawing Sheets

(51) Int. Cl.

| | |
|---|---|
| ***H05K 5/00*** | (2025.01) |
| ***H05K 7/00*** | (2006.01) |
| ***H05K 7/14*** | (2006.01) |
| ***H05K 7/18*** | (2006.01) |

(56) References Cited

U.S. PATENT DOCUMENTS

| | | | | |
|---|---|---|---|---|
| 11,742,772 B1 * | 8/2023 | Wen | H02B 1/04 | |
| | | | 361/679.01 | |
| 11,949,283 B2 * | 4/2024 | Sunde | H02J 9/068 | |
| 2016/0204582 A1 * | 7/2016 | Lee | H02B 11/00 | |
| | | | 361/624 | |
| 2017/0005514 A1 * | 1/2017 | Merkel | H02J 1/102 | |
| 2017/0170638 A1 * | 6/2017 | Waynick, Sr. | H02B 11/173 | |
| 2022/0059895 A1 * | 2/2022 | Pan | H01M 10/425 | |
| 2023/0207937 A1 * | 6/2023 | Mu | H01M 50/204 | |
| | | | 320/112 | |
| 2024/0223094 A1 * | 7/2024 | Li | H02J 4/25 | |

FOREIGN PATENT DOCUMENTS

| | | | |
|---|---|---|---|
| CN | 114465303 | A | 5/2022 |
| CN | 216959380 | U | 7/2022 |
| CN | 217984867 | U | 12/2022 |
| CN | 218124542 | U | 12/2022 |
| CN | 219417622 | U | 7/2023 |
| CN | 219554655 | U | 8/2023 |
| CN | 117040246 | A | 11/2023 |
| EP | 4422057 | A1 | 8/2024 |

* cited by examiner

POWER BOOST AND CONVERSION SYSTEM

CROSS REFERENCE TO RELATED APPLICATIONS

The present application claims the benefit of priority under the Paris Convention to Chinese Patent Application No. 202411471457.0 filed on Oct. 21, 2024, which is incorporated herein by reference in its entirety.

TECHNICAL FIELD

Embodiments of the present disclosure relate to the field of energy storage technology, and in particular to a power boost and conversion system.

BACKGROUND

A high-voltage box and a power conversion system (PCS) are core components of an energy storage system. PCS is the core component that allows bidirectional transfer of power between the energy storage system and the power grid. PCS is used to control the charging and discharging process of batteries and performs alternating current (AC)/direct current (DC) conversion. The high-voltage box is equipped with a control circuit for controlling the charging and discharging process, in order to ensure the safety and stability of the energy storage system.

At present, an AC cabinet and a DC cabinet of an energy storage system are usually separated, this design brings a series of problems and challenges. The separated design leads to a wide variety of equipment of an energy storage system, such as PCS, battery management system (BMS), and the like. The wide variety of equipment is not conducive to the high integration of the energy storage system, and each equipment requires installation and commissioning. Moreover, components of the equipment usually use different interfaces and communication protocols, which greatly increases the workload and complexity of on-site commissioning, resulting in extended commissioning cycles.

SUMMARY

Embodiments of the present disclosure provide a power boost and conversion system, which is at least conducive to achieving the high integration of the energy storage systems.

Some embodiments of the present disclosure provide a power boost and conversion system, including: a cabinet including a control portion, a conversion portion, and a partition plate arranged between the control portion and the conversion portion, where the control portion is configured to accommodate a control circuit, and the conversion portion is configured to accommodate a first converter and a second converter, and where the control circuit includes a first circuit breaker and a second circuit breaker; and a first frame including a first riser and a first cross plate, where a bottom end of the first riser is fixed to an inner bottom surface of the cabinet, a top end of the first riser is fixed to an end of the first cross plate, and an other end of the first cross plate is fixed to an inner wall of the cabinet, and where the first circuit breaker and the second circuit breaker are fixed to the first riser, and the first circuit breaker is arranged to be closer to the top end of the first riser than the second circuit breaker. A positive input terminal and a negative input terminal of the first circuit breaker are respectively connected to a first battery positive interface and a first battery negative interface outside the cabinet. A positive input terminal and a negative input terminal of the second circuit breaker are respectively connected to a second battery positive interface and a second battery negative interface outside the cabinet.

In some embodiments, the first frame further includes a bottom plate fixed to the inner bottom surface of the cabinet, the bottom end of the first riser is fixed to an end of the bottom plate, and the second circuit breaker is arranged on the bottom plate to separate the second circuit breaker from the inner bottom surface of the cabinet.

In some embodiments, in a vertical direction, the first circuit breaker is arranged to separate from the second circuit breaker by a distance ranged from 10 mm to 15 mm.

In some embodiments, the control circuit further includes a first fuse, a second fuse, a first relay, a second relay, a third relay, and a fourth relay. A positive output terminal of the first circuit breaker is connected to the first converter via the first fuse and the first relay connected in series, and a negative output terminal of the first circuit breaker is connected in series to the first converter via the second relay. A positive output terminal of the second circuit breaker is connected to the second converter via the second fuse and the third relay connected in series, and a negative output terminal of the second circuit breaker is connected in series to the second converter via the fourth relay.

In some embodiments, the power boost and conversion system further includes a second frame including second risers and a second cross plate, where a respective bottom end of each second riser of the second risers is fixed to the inner bottom surface of the cabinet, a respective top end of each second riser of the second risers is fixed to an end of the second cross plate, and an other end of the second cross plate is fixed to an inner wall of the cabinet. The first fuse and the second fuse are fixed on the second cross plate, and the first relay, the second relay, the third relay, and the fourth relay are arranged below the second cross plate.

In some embodiments, the positive input terminal of the first circuit breaker is connected to the first battery positive interface via a first copper bar, and the positive input terminal of the second circuit breaker is connected to the second battery positive interface via a second copper bar. The control circuit further includes a first Hall element passed through by the first copper bar and a second Hall element passed through by the second copper bar. The power boost and conversion system further includes a third frame including a support portion fixed to an inner wall of the cabinet and a protruding portion protruding from the support portion, and the first Hall element and the second Hall element are fixed on the protruding portion and are arranged to separate from each other in a vertical direction.

In some embodiments, the negative input terminal of the first circuit breaker is connected to the first battery negative interface via a third copper bar, the negative input terminal of the second circuit breaker is connected to the second battery negative interface via a fourth copper bar, and the third copper bar, the first copper bar, the fourth copper bar, and the second copper bar are arranged in sequence along the vertical direction. A shielding layer is arranged on a surface of the fourth copper bar and arranged between the first Hall element and the second Hall element.

In some embodiments, a plurality of heat-dissipation through holes are defined on the partition plate, and an exhaust fan is provided on a side of the plurality of heat-dissipation through holes facing the conversion portion.

In some embodiments, the power boost and conversion system further includes a liquid cooling module arranged in the conversion portion, and an outlet direction of the exhaust fan directs towards the liquid cooling module.

In some embodiments, the power boost and conversion system further includes a first high-voltage output terminal and a second high-voltage output terminal arranged outside the cabinet. The first high-voltage output terminal includes a first high-voltage positive interface, a first high-voltage negative interface, and a first high-voltage ground interface, and the second high-voltage output terminal includes a second high-voltage positive interface, a second high-voltage negative interface, and a second high-voltage ground interface. The first high-voltage output terminal is connected to the first converter arranged in the conversion portion via a first set of high-voltage copper bars, and the second high-voltage output terminal is connected to the second converter arranged in the conversion portion via a second set of high-voltage copper bars. The power boost and conversion system further includes a shielding cover fixed to an inner wall of the cabinet to form a shielding space, and the first set of high-voltage copper bars and the second set of high-voltage copper bars are arranged in the shielding space.

In some embodiments, two ends of the first fuse are respectively connected to the positive output terminal of the first circuit breaker and to the first relay via first low-voltage copper bars, and the first low-voltage copper bars are fixed to the second cross plate via insulation columns to leave a spacing between the first fuse and the second cross plate. Two ends of the second fuse are respectively connected to the positive output terminal of the second circuit breaker and to the third relay via second low-voltage copper bars, and the second low-voltage copper bars are fixed to the second cross plate via insulation columns to leave a spacing between the second fuse and the second cross plate.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations. In order to illustrate the technical solutions in related technologies or in the embodiments of the present disclosure more clearly, the drawings to be used in the description of the embodiments will be briefly described below. It is obvious that the drawings mentioned in the following description are only some embodiments of the present disclosure. For those of ordinary skill in the art, other drawings may also be obtained in accordance with these drawings without any inventive effort.

DETAILED DESCRIPTION OF THE EMBODIMENTS

Figure 1:
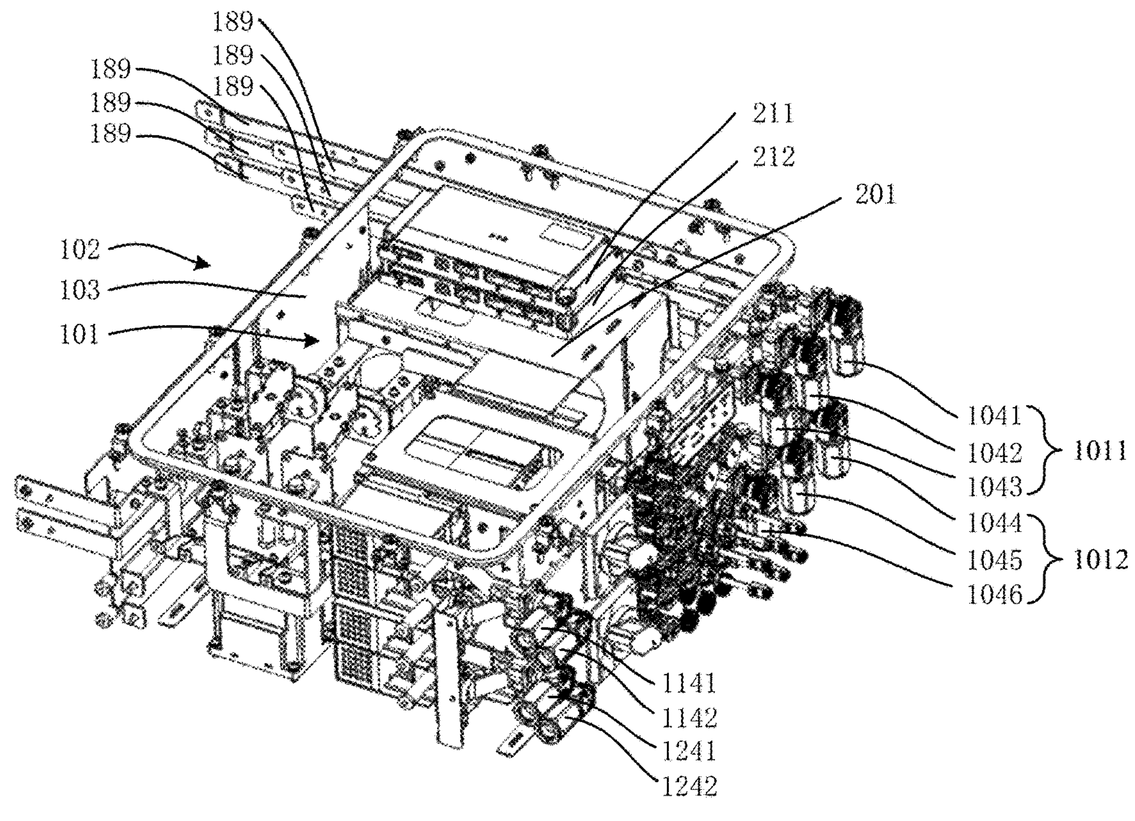
FIG. 1 schematically shows, in a viewpoint, a structure of a power boost and conversion system provided in some embodiments of the present disclosure.

It is known from background that an AC cabinet and a DC cabinet of an energy storage system are usually separated. Due to the large number of delicate electronics in the high-voltage box of the energy storage system, and the high working voltage of the high-voltage box, when the large number of delicate electronics are arranged randomly, it is prone to cause mutual interference between electrical elements, leading to failure of electrical elements and even arcing between electrical elements, which results in a safety hazard and affects reliability of the products. Although the separated design can prevent the problem of mutual interference between elements, it also can lead to a wide variety of equipment of the energy storage system.

Embodiments of the present disclosure provide a power boost and conversion system. The power boost and conversion system includes a cabinet including a control portion, a conversion portion, and a partition plate arranged between the control portion and the conversion portion. The control portion is configured to accommodate a control circuit, and the conversion portion is configured to accommodate a first converter and a second converter. By integrating PCS and the elements in the high-voltage box into a same cabinet, the space occupied by PCS and the high-voltage box in the energy storage system can be reduced, and the standard costs of raw materials, components, tools, and labor required in the manufacturing process of the energy storage system can be significantly reduced. Moreover, the difficulty in external wiring and the complexity of system can also be reduced, thereby reducing the number of DC cables, eliminating potential fault points, and improving the reliability of the system. By separating the control portion from the conversion portion using the partition plate, the problem of interference between the control circuit in the control portion and the PCS in the conversion portion can be prevented, thereby improving the stability of the power boost and conversion system during usage.

Furthermore, in the control portion of the cabinet, the first circuit breaker, the second circuit breaker, the first fuse, the second fuse, the first relay, the second relay, the third relay, and the fourth relay in the control circuit form two high-voltage control circuits being respectively connected to the first converter and the second converter. In this way, PCS is highly integrated with the high-voltage box, thereby further improving the integration density of the power boost and conversion system, allowing one power boost and conversion system to be in connection with two battery modules. The first circuit breaker is arranged to be closer to the top end of the first riser than the second circuit breaker by means of the first frame, and the first fuse and the second fuse are arranged above the first relay, the second relay, the third relay, and the fourth relay by means of the second frame. In this way, not only the high integration, but also the safe distances between various elements in the control circuit can be ensured, thereby preventing mutual interference between electrical elements and improving the reliability and safety of the power boost and conversion system.

The embodiments of the present disclosure will be illustrated in detail below with reference to the accompanying drawings. Those of ordinary skill in the art shall understand that in the embodiments of the present disclosure, many technical details are provided for readers to better understand the present disclosure. However, even without these technical details and various changes and modifications based on the following embodiments, the technical solutions set forth in the present disclosure can also be realized.

In the illustration of the embodiments of the present disclosure, technical terms such as “first” and “second” are only used to distinguish different objects and shall not be understood as indicating or implying relative importance or implying the quantity, specific order, or primary and secondary relationship of the indicated technical features.

In the illustration of the embodiments of the present disclosure, “a plurality of” refers to two or more, unless otherwise specified.

Referring to “embodiments” in the present disclosure indicates that specific features, structures, or characteristics described in conjunction with the embodiments may be included in at least one embodiment of the present disclosure. Referring to this phrase at various portions in the description does not necessarily relates to the same embodiment, nor an independent or alternative embodiment that is mutually exclusive with other embodiments. Those skilled in the art shall explicitly and implicitly understand that the embodiments described in the present disclosure can be combined with other embodiments.

In the illustration of the embodiments of the present disclosure, the term “and/or” is only used for describing the association relationships between associated objects, indicating that there can be three types of relationships. For example, A and/or B represents: the existence of A, the concurrent existence of A and B, and the existence of B. In addition, the character “/” in the present disclosure generally indicates that the associated objects are in an “or” relationship.

In the illustration of the embodiments of the present disclosure, the technical terms “center”, “longitudinal”, “transverse”, “length”, “width”, “thickness”, “up”, “down”, “front”, “back”, “left”, “right”, “vertical”, “horizontal”, “top”, “bottom”, “inside”, “outside”, “clockwise”, “counterclockwise”, “axial”, “radial”, “circumferential” and other directional or positional relationships are based on the directional or positional relationships shown in the accompanying drawings, only for the convenience of illustrating the embodiments of the present disclosure and simplifying the illustration, and do not indicate or imply that the devices or components referred to must have specific orientations, or be constructed and operated in specific orientations, and therefore shall not be understood as limitations on the embodiments of the present disclosure.

In the illustration of the embodiments of the present disclosure, unless otherwise specified and limited, technical terms such as “installation”, “engagement”, “connection”, or “fixation” should be broadly understood. For example, “connection” may refer to fixed connections, detachable connections, integrated as a whole, mechanical connections or electrical connections, direct connections or indirect connections through an intermediate medium, or internal connections between two components or an interaction relationship between two components. For those skilled in the art, the specific meanings of the above terms in the embodiments of the present disclosure can be understood according to the specific situations.

In the illustration of the embodiments of the present disclosure, when a component “includes” another component, other components are not excluded unless otherwise stated, and other components may be further included.

The terms used in the illustration of various embodiments in the present disclosure are only intended to illustrate specific embodiments and are not intended to be limiting. As used in the illustration of various embodiments and the accompanying claims, “the component” is also intended to include the plural form, unless the context otherwise specifies.

Figure 2:
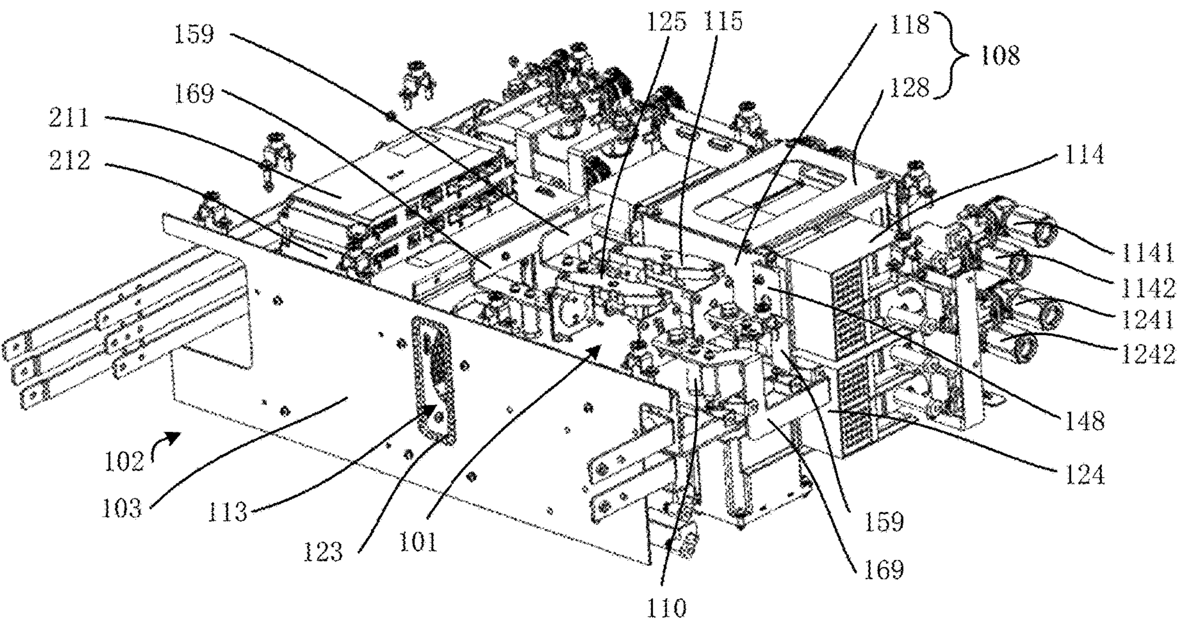
FIG. 2 schematically shows, in another viewpoint, the structure of the power boost and conversion system provided in some embodiments of the present disclosure.
Figure 3:
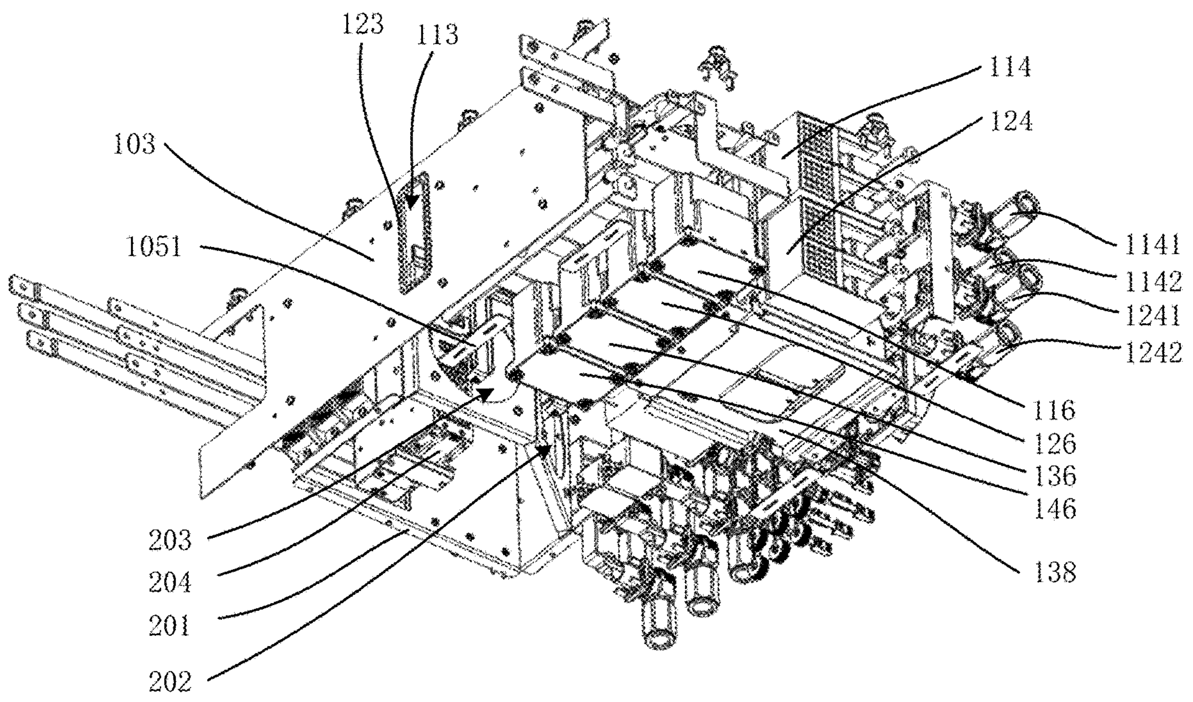
FIG. 3 schematically shows, in an elevated viewing angle, the structure of the power boost and conversion system provided in some embodiments of the present disclosure.

FIG. 1 schematically shows, in a viewpoint, a structure of a power boost and conversion system provided in some embodiments of the present disclosure. FIG. 2 schematically shows, in another viewpoint, the structure of the power boost and conversion system provided in some embodiments of the present disclosure. FIG. 3 schematically shows, in an elevated viewing angle, the structure of the power boost and conversion system provided in some embodiments of the present disclosure. In FIGS. 1 to 3, for the convenience of illustrating the internal structure of the power boost and conversion system, the cabinet is shown in a perspective way.

Referring to FIGS. 1 to 3, the power boost and conversion system provided in some embodiments of the present disclosure includes a cabinet (in a perspective state) including a control portion 101, a conversion portion 102, and a partition plate 103 arranged between the control portion 101 and the conversion portion 102. The control portion 101 is configured to accommodate a control circuit, and the conversion portion 102 is configured to accommodate a first converter (not shown) and a second converter (not shown). By integrating PCS and the elements in the high-voltage box into a same cabinet, the space occupied by PCS and the high-voltage box in the energy storage system can be reduced, and the standard costs of raw materials, components, tools, and labor required in the manufacturing process of the energy storage system can be significantly reduced. Moreover, the difficulty in external wiring and the complexity of system can also be reduced, thereby reducing the number of DC cables, eliminating potential fault points, and improving the reliability of the system. By separating the control portion 101 from the conversion portion 102 using the partition plate 103, the problem of interference between the control circuit in the control portion 101 and the PCS in the conversion portion 102 can be prevented, thereby improving the stability of the power boost and conversion system during usage.

In some embodiments, the control circuit in the control portion 101 includes a first circuit breaker 114 and a second circuit breaker 124. In some embodiments, the control circuit in the control portion 101 further includes a first fuse 115, a second fuse 125, a first relay 116, a second relay 126, a third relay 136, and a fourth relay 146.

A positive input terminal and a negative input terminal of the first circuit breaker 114 are respectively connected to a first battery positive interface 1142 and a first battery negative interface 1141 outside the cabinet. A positive output terminal of the first circuit breaker 114 is connected to the first converter via the first fuse 115 and the first relay 116 connected in series, and a negative output terminal of the first circuit breaker 114 is connected in series to the first converter via the second relay 126. In this way, the positive input terminal of the first circuit breaker 114, the first fuse 115, and the first relay 116 are connected in series to form a positive-terminal circuit between the positive terminal of a battery module and the first converter, and the negative output terminal of the first circuit breaker 114 and the second relay 126 are connected in series to form a negative-terminal circuit between the negative terminal of the battery module and the first converter. The first circuit breaker 114, the first fuse 115, the first relay 116, and the second relay 126 form a circuit for controlling the turning on and turning off between the first converter and the battery module.

A positive input terminal and a negative input terminal of the second circuit breaker 124 are respectively connected to a second battery positive interface 1242 and a second battery negative interface 1241 outside the cabinet. A positive output terminal of the second circuit breaker 124 is connected to the second converter via the second fuse 125 and the third relay 136 connected in series, and a negative output terminal of the second circuit breaker 124 is connected in series to the second converter via the fourth relay 146. In this way, the positive input terminal of the second circuit breaker 124, the second fuse 125, and the third relay 136 are connected in series to form a positive-terminal circuit between the positive terminal of another battery module and the second converter, and the negative output terminal of the second circuit breaker 124 and the fourth relay 146 are connected in series to form a negative-terminal circuit between the negative terminal of another battery module and the second converter. The second circuit breaker 124, the second fuse 125, the third relay 136, and the fourth relay 146 form a circuit for controlling the turning on and turning off between the second converter and another battery module.

Referring to FIG. 2, the power boost and conversion system further includes a first frame 108 including a first riser 118 and a first cross plate 128. A bottom end of the first riser 118 is fixed to an inner bottom surface of the cabinet, a top end of the first riser 118 is fixed to an end of the first cross plate 128, and the other end of the first cross plate 128 is fixed to an inner wall of the cabinet. The first circuit breaker 114 and the second circuit breaker 124 are fixed to the first riser 118, and the first circuit breaker 114 is arranged to be closer to the top end of the first riser than the second circuit breaker 124. In some embodiments, the first circuit breaker 114 and the second circuit breaker 124 are respectively fixed to the first riser 118 by a plurality of screws passing through the first riser 118, and a safety spacing is left between the first circuit breaker 114 and the second circuit breaker 124.

Thus, the first circuit breaker 114 is arranged above the second circuit breaker 124 by means of the first frame 108. In this way, not only the high integration, but also the safe distance between the first circuit breaker 114 and the second circuit breaker 124 in the control circuit can be ensured, thereby preventing mutual interference between the first circuit breaker 114 and the second circuit breaker 124 and improving the reliability and safety of the power boost and conversion system.

In some embodiments, the material of the first frame 108 may be either a metallic material or a non-metallic material. Metallic materials can improve the thermal conductivity of the first frame 108, thereby facilitating the dissipation of heat from the first circuit breaker 114 and the second circuit breaker 124 by the first frame 108. Additionally, metallic materials have high mechanical strength, which can provide sufficient support strength to the first circuit breaker 114 and the second circuit breaker 124. Non-metallic materials can prevent conductivity between the first circuit breaker 114 or the second circuit breaker 124, thereby improving the stability during usage of the first circuit breaker 114 or the second circuit breaker 124.

In a vertical direction (or a direction perpendicular to the bottom surface of the cabinet), the safety spacing between the first circuit breaker 114 and the second circuit breaker 124 ranges from 10 mm to 15 mm, for example 10 mm, 10.3 mm, 11 mm, 11.4 mm, 12 mm, 12.5 mm, 13 mm, 13.6 mm, 14 mm, 14.4 mm or 15 mm. In this way, there can be sufficient safety distance between the first circuit breaker 114 and the second circuit breaker 124, without wasting space due to the excessively large distance between the first circuit breaker 114 and the second circuit breaker 124.

Referring to FIGS. 2 and 3, the first frame 108 may further include a bottom plate 138 fixed to the inner bottom surface of the cabinet. The bottom end of the first riser 118 is fixed to an end of the bottom plate 138, and the second circuit breaker 124 is arranged on the bottom plate 138 to separate the second circuit breaker 124 from the inner bottom surface of the cabinet. In this way, on the one hand, the spacing between the bottom of the second circuit breaker 124 and the bottom surface of the cabinet can facilitate the heat dissipation of the second circuit breaker 124, thereby improving the stability during usage of the second circuit breaker 124. On the other hand, the bottom plate 138, the first riser 118, and the first cross plate 128 can form the first frame 108 having a "C" shape, which is conducive to improvement of the stability of the first frame 108.

Each of the first riser 118 and the first cross plate 128 of the first frame 108 may have at least one respective through hole. On the one hand, the through holes are conducive to reduce in the weight of the first frame 108, thereby reducing the total mass of the power boost and conversion system. On the other hand, the through holes can facilitate the heat dissipation of the first circuit breaker 114 or the second circuit breaker 124, thereby improving the stability during usage of the power boost and conversion system.

When the first frame 108 further includes the bottom plate 138, the bottom plate 138 may also have least one through hole, thereby reducing the total mass of the power boost and conversion system, and improving the heat dissipation effect of the second circuit breaker 124.

The power boost and conversion system may further include an arc extinguishing chamber 148 extending along the vertical direction and fixed on the first riser 118. The arc extinguishing chamber 148 can allow the arc generated by the first circuit breaker 114 and the second circuit breaker 124 to come into contact with a solid medium, reduce the temperature of the arc, and accelerate the extinguishing of the arc, thereby improving the stability during usage of the first circuit breaker 114 and the second circuit breaker 124.

Figure 4:
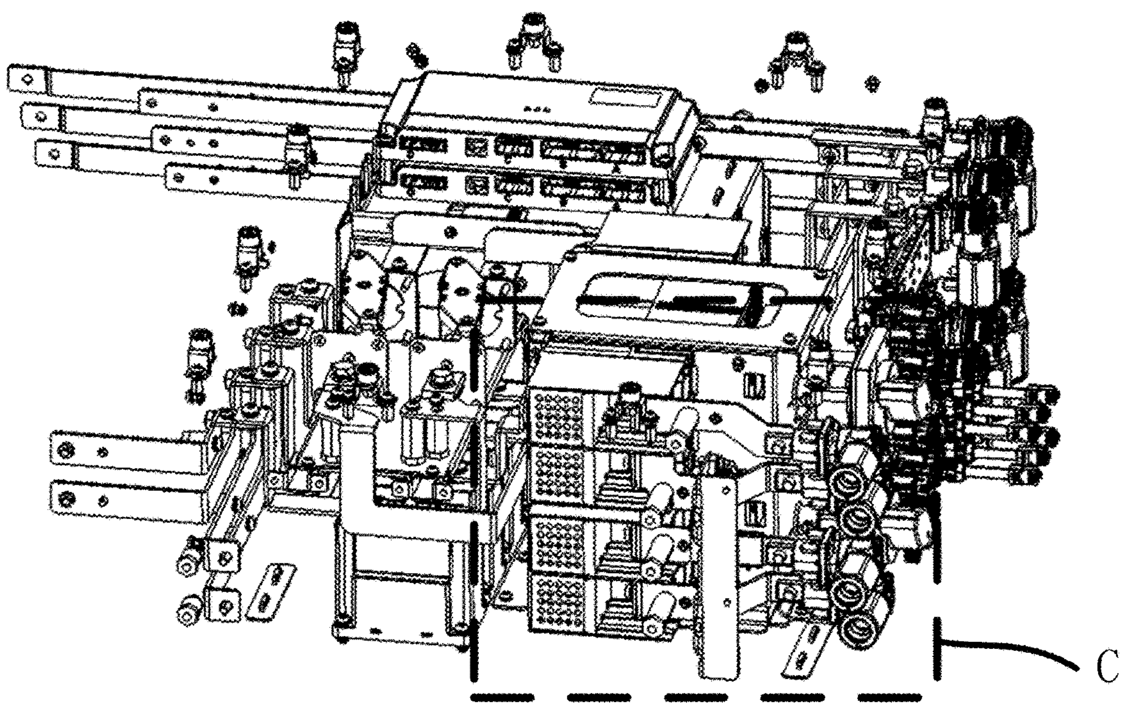
FIG. 4 schematically shows, in yet another viewpoint, the structure of the power boost and conversion system provided in some embodiments of the present disclosure.
Figure 5:
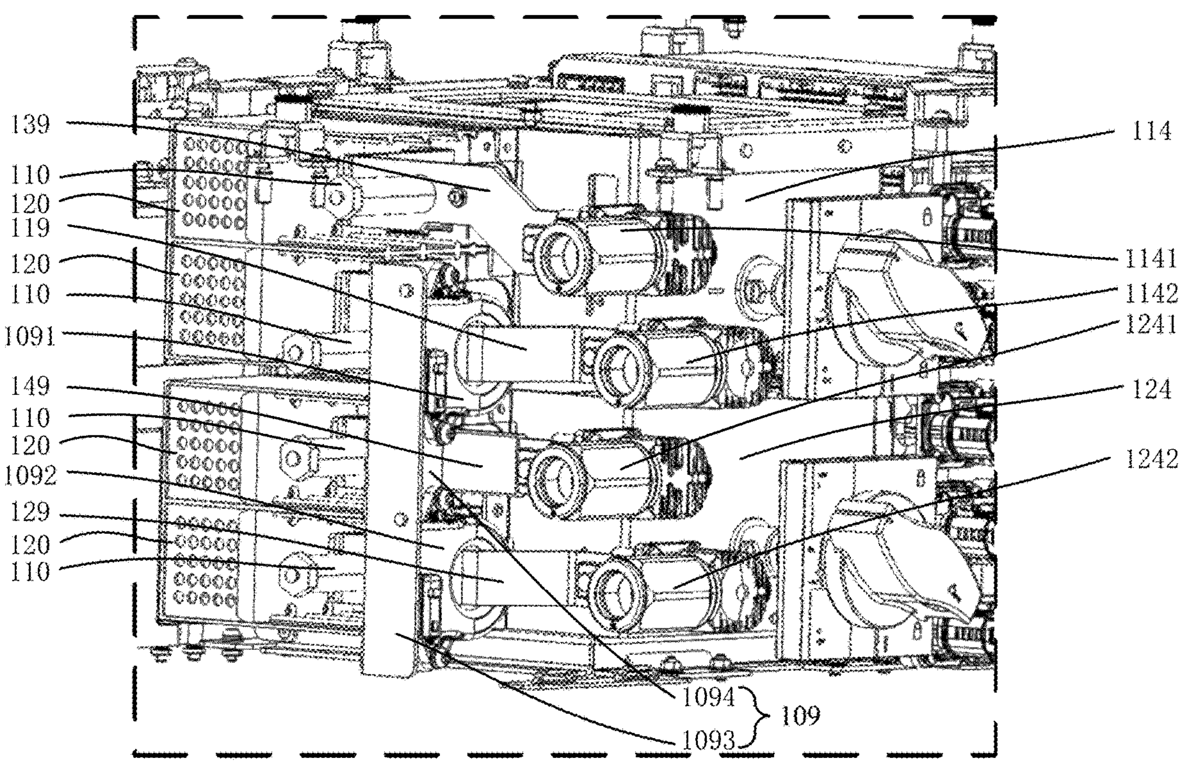
FIG. 5 is an enlarged schematic diagram of a local structure shown by the dashed box C in FIG. 4.

FIG. 4 schematically shows, in yet another viewpoint, the structure of the power boost and conversion system provided in some embodiments of the present disclosure. FIG. 5 is an enlarged schematic diagram of a local structure shown by the dashed box C in FIG. 4.

Referring to FIGS. 4 and 5, the positive input terminal of the first circuit breaker 114 is connected to the first battery positive interface 1142 via a first copper bar 119, and the positive input terminal of the second circuit breaker 124 is connected to the second battery positive interface 1242 via a second copper bar 129. The negative input terminal of the first circuit breaker 114 is connected to the first battery negative interface 1141 via a third copper bar 139, the negative input terminal of the second circuit breaker 124 is connected to the second battery negative interface 1241 via a fourth copper bar 149, and the third copper bar 139, the first copper bar 119, the fourth copper bar 149, and the second copper bar 129 are arranged in sequence along the vertical direction.

Referring to FIGS. 4 and 5, the control circuit may further include a first Hall element 1091 passed through by the first copper bar 119 and a second Hall element 1092 passed through by the second copper bar 129. The power boost and conversion system further includes a third frame 109 including a support portion 1093 fixed to an inner wall of the cabinet and a protruding portion 1094 protruding from the support portion 1093, and the first Hall element 1091 and the second Hall element 1092 are fixed on the protruding portion 1094 and are arranged to separate from each other in the vertical direction. In some embodiments, each of the first Hall element 1091 and the second Hall element 1092 is fixed on the protruding portion 1094 by a respective screw passing through the protruding portion 1094. The first Hall element 1091 and the second Hall element 1092 can convert many non-electric or non-magnetic physical quantities such as force, torque, pressure, stress, position, displacement, velocity, acceleration, angle, angular velocity, revolution, rotation speed, and the moment when the working state changes into electrical quantities for detection and control. With the first Hall element 1091 and the second Hall element 1092, the status of current amount of the first copper bar 119 and the second copper bar 129 can be detected, thereby achieving monitoring of the power boost and conversion system. Moreover, the first Hall element 1091 is arranged above the second Hall element 1092 by means of the third frame 109, in this way, not only the high integration, but also the safe distance between the first Hall element 1091 and the second Hall element 1092 can be ensured, thereby preventing mutual interference between the first Hall element 1091 and the second Hall element 1092, and improving the reliability and safety of the power boost and conversion system.

In some embodiments, a shielding layer is arranged on a surface of the fourth copper bar 149 and arranged between the first Hall element 1091 and the second Hall element 1092. The shielding layer can prevent electromagnetic interference between the first and second Hall elements and the fourth copper bar 149, thereby improving the stability during usage of the power boost and conversion system.

In some embodiments, each of the first copper bar 119, the second copper bar 129, the third copper bar 139, and the fourth copper bar 149 may be fixed to an inner wall of the cabinet by a respective insulation column 110. Because the third copper bar 139, the first copper bar 119, the fourth copper bar 149, and the second copper bar 129 are arranged in sequence along the vertical direction, fixing each copper bar using a respective insulation column 110 can improve the stability of the copper bars, and prevent interference or leakage between adjacent copper bars.

In some embodiments, in the vertical direction (or the direction perpendicular to the bottom surface of the cabinet), a distance between every two adjacent copper bars ranges from 10 mm to 15 mm, for example 10 mm, 10.3 mm, 11 mm, 11.4 mm, 12 mm, 12.5 mm, 13 mm, 13.6 mm, 14 mm, 14.4 mm or 15 mm. Herein, the adjacent copper bars refer to the third copper bar 139 and the first copper bar 119, or the first copper bar 119 and the fourth copper bar 149, or the fourth copper bar 149 and the second copper bar 129. In this way, there can be sufficient safety distance between every two adjacent copper bars, without wasting space due to excessive spacing between copper bars.

Referring to FIGS. 4 and 5, each of the positive input terminal of the first circuit breaker 114, the negative input terminal of the first circuit breaker 114, the positive input terminal of the second circuit breaker 124, and the negative input terminal of the second circuit breaker 124 is provided with a respective insulation cover 120. The insulation covers 120 can isolate adjacent third copper bar 139, first copper bar 119, fourth copper bar 149, and second copper bar 129, thereby preventing the mutual interference between adjacent copper bars.

Figure 6:
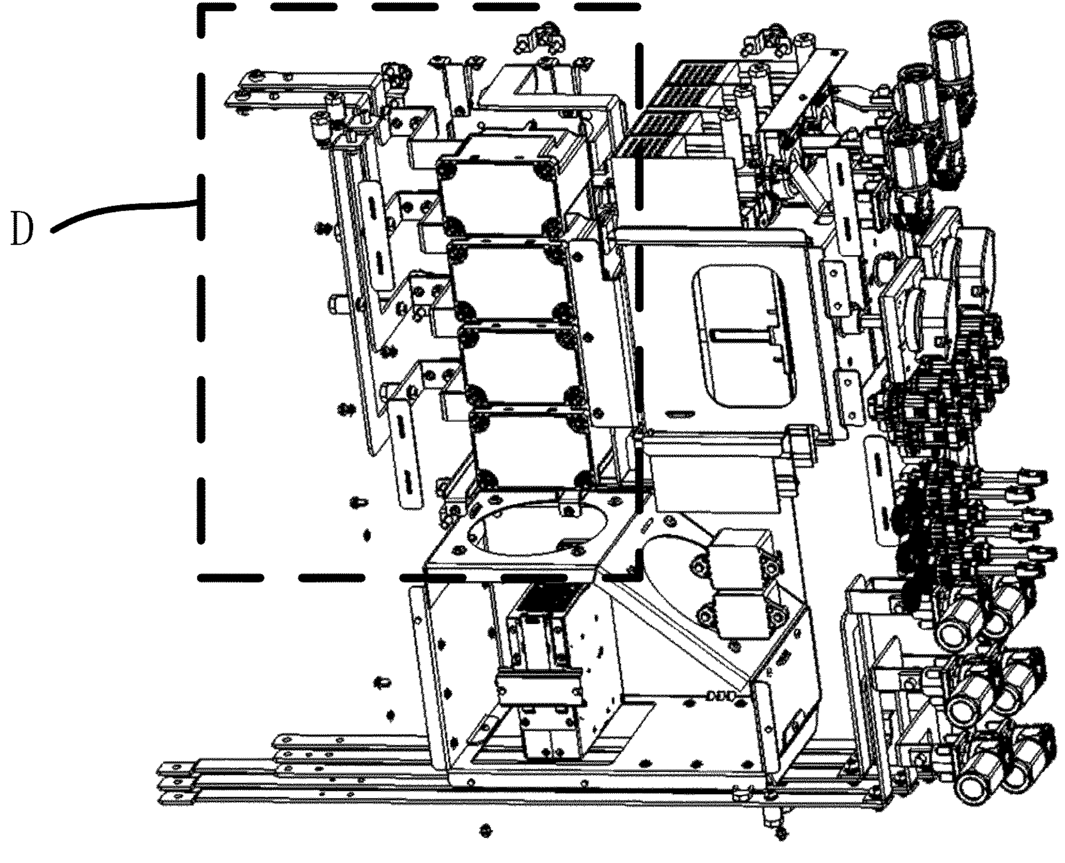
FIG. 6 schematically shows, in another elevated viewing angle, the structure of the power boost and conversion system provided in some embodiments of the present disclosure.
Figure 7:
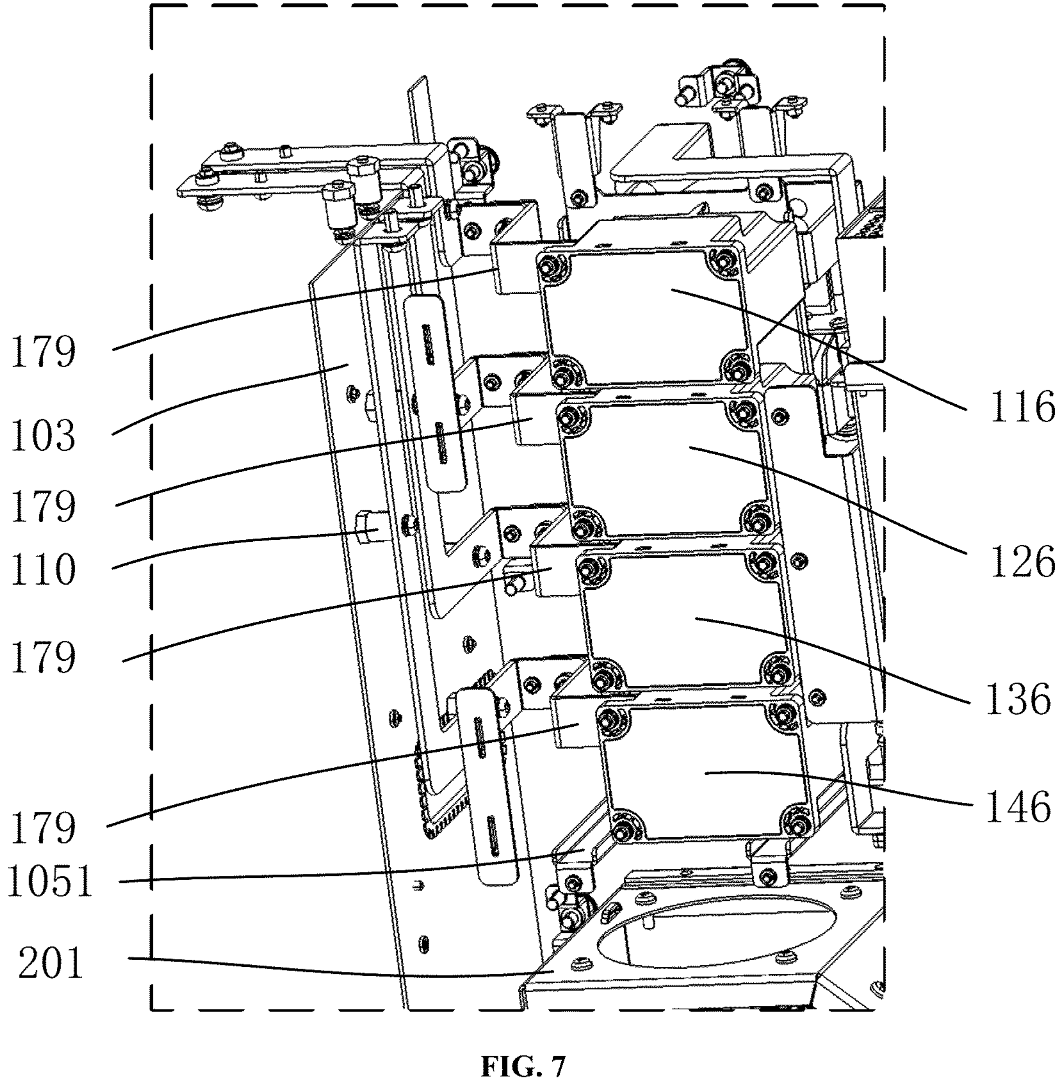
FIG. 7 is an enlarged schematic diagram of a local structure shown by the dashed box D in FIG. 6.
Figure 8:
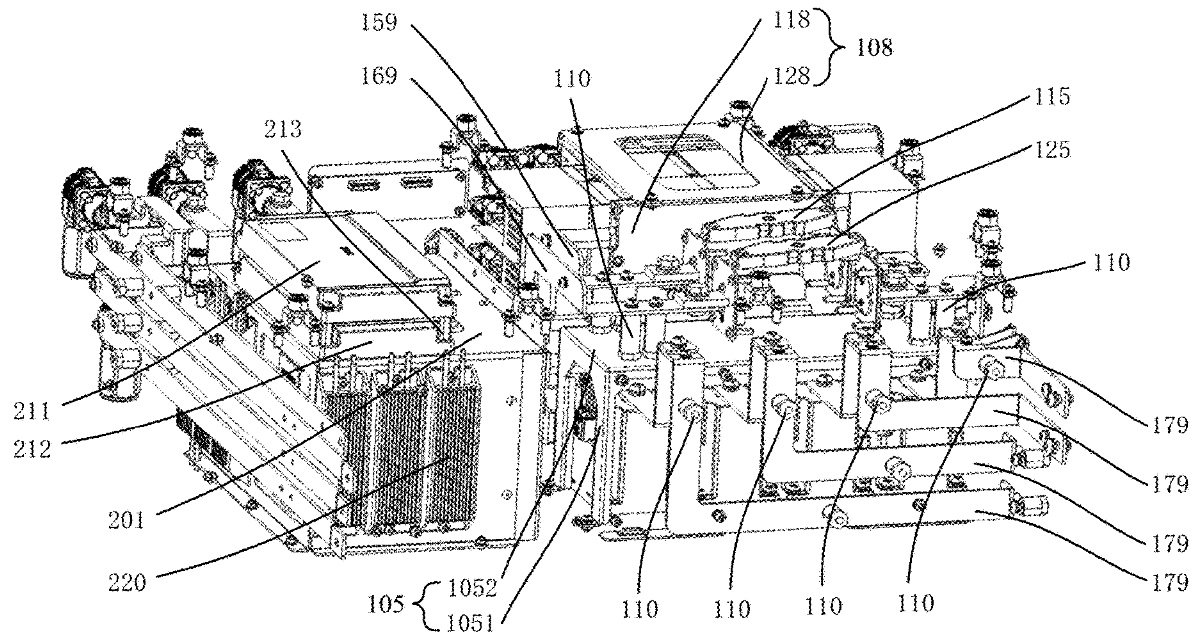
FIG. 8 schematically shows, in still another viewpoint, the structure of the power boost and conversion system provided in some embodiments of the present disclosure.

FIG. 6 schematically shows, in another elevated viewing angle, the structure of the power boost and conversion system provided in some embodiments of the present disclosure. FIG. 7 is an enlarged schematic diagram of a local structure shown by the dashed box D in FIG. 6. FIG. 8 schematically shows, in still another viewpoint, the structure of the power boost and conversion system provided in some embodiments of the present disclosure.

Referring to FIGS. 6 to 8, in some embodiments, the power boost and conversion system further includes a second frame 105 including second risers 1051 and a second cross plate 1052. A respective bottom end of each second riser of the second risers 1051 is fixed to the inner bottom surface of the cabinet, a respective top end of each second riser of the second risers 1051 is fixed to an end of the second cross plate 1052, and the other end of the second cross plate 1052 is fixed to an inner wall of the cabinet. The first fuse 115 and the second fuse 125 are fixed on the second cross plate 1052, and the first relay 116, the second relay 126, the third relay 136, and the fourth relay 146 are arranged below the second cross plate 1052. The first fuse 115 and the second fuse 125 are arranged above the first relay 116, the second relay 126, the third relay 136, and the fourth relay 146 by means of the second frame 105, in this way, not only the high integration, but also the safe distances between the fuses and the relays in the control circuit can be ensured, thereby preventing mutual interference between the fuses and the relays, and improving the reliability and safety of the power boost and conversion system.

In some embodiments, the material of the second frame 105 may be either a metallic material or a non-metallic material. Metallic materials can improve the thermal conductivity of the second frame 105, thereby facilitating the dissipation of heat from the fuses or the relays by the second frame 105. Additionally, metallic materials have high mechanical strength, which can provide sufficient support force to the first fuse 115 and the second fuse 125. Non-metallic materials can prevent conductivity between the fuses and the relays, thereby improving the stability during usage of the fuses and the relays.

Referring to FIGS. 6 to 8, two ends of the first fuse 115 are respectively connected to the positive output terminal of the first circuit breaker 114 and to the first relay 116 via first low-voltage copper bars 159, and the first low-voltage copper bars 159 are fixed to the second cross plate 1052 via insulation columns 110 to leave a spacing between the first fuse 115 and the second cross plate 1052. Two ends of the second fuse 125 are respectively connected to the positive output terminal of the second circuit breaker 124 and to the third relay 136 via second low-voltage copper bars 169, and the second low-voltage copper bars 169 are fixed to the second cross plate 1052 via insulation columns 110 to leave a spacing between the second fuse 125 and the second cross plate 1052. In this way, the first fuse 115 and the second fuse 125 can be in no contact with the second cross plate 1052, and regardless of a metallic or a non-metallic second frame 105, mutual interference between the fuses and the second cross plate 1052 can be prevented. Moreover, the first low-voltage copper bars 159 and the second low-voltage copper bars 169 are fixed to the second cross plate 1052 by the insulation columns 110, thereby preventing the problem of leakage or short-circuit caused by the shaking of the first low-voltage copper bars 159 and the second low-voltage copper bars 169, and improving the stability during usage of the power boost and conversion system.

In some embodiments, the negative output terminal of the first circuit breaker is connected to the second relay via a third low-voltage copper bar, the negative output terminal of the second circuit breaker is connected to the fourth relay via a fourth low-voltage copper bar, and a respective distance between every two of one respective first low-voltage copper bar of the first low-voltage copper bars, one respective second low-voltage copper bar of the second low-voltage copper bars, the third low-voltage copper bar, and the fourth low-voltage copper bar is greater than or equal to 10 mm, for example 10 mm, 10.5 mm, 11 mm, 11.6 mm, 12 mm, 12.4 mm, or 13 mm, 13.6 mm, 14 mm, 14.4 mm, or 15 mm. Each of the first circuit breaker and the second circuit breaker is connected to corresponding relay and fuse via a respective copper bar, due to the fact that the first circuit breaker and the second circuit breaker are arranged along the vertical direction, the fuses and relays are also arranged along the vertical direction, and these elements are connected with each other using copper bars, it can be understood that preventing leakage or short-circuit between adjacent copper bars is required. Therefore, a respective distance between every two adjacent low-voltage copper bars shall be set to be greater than or equal to 10 mm.

In some embodiments, each of the first low-voltage copper bars, the second low-voltage copper bars, the third low-voltage copper bar, and the fourth low-voltage copper bar is fixed on the first riser via at least one respective insulation column. In this way, the stability of the first low-voltage copper bars, the second low-voltage copper bars, the third low-voltage copper bar, and the fourth low-voltage copper bar can be improved, thereby preventing the leakage or short-circuit between adjacent copper bars caused by the shaking of copper bars.

Referring to FIGS. 6 to 8, the first relay 116 and the second relay 126 are respectively connected to the first converter via at least some of fifth low-voltage copper bars 179, the third relay 136 and the fourth relay 146 are respectively connected to the second converter via at least some of the fifth low-voltage copper bars. In this way, both the first converter and the second converter are connected to the control circuit via the fifth low-voltage copper bars, and the fifth low-voltage copper bars 179 have excellent conductivity and thermal conductivity, therefore can carry high currents and ensure stable operation of the circuits.

In some embodiments, each of the fifth low-voltage copper bars 179 is fixed to the partition plate 103 via at least one respective insulation column 110. In this way, the stability of the fifth low-voltage copper bars 179 can be improved, thereby preventing the leakage or short-circuit between adjacent fifth low-voltage copper bars 179 caused by the shaking of the fifth low-voltage copper bars 179.

In some embodiments, a respective distance between every two adjacent fifth low-voltage copper bars 179 is greater than or equal to 10 mm, for example 10 mm, 10.5 mm, 11 mm, 11.6 mm, 12 mm, 12.4 mm or 13 mm, 13.6 mm, 14 mm, 14.4 mm or 15 mm. There needs to be sufficient safety distance between adjacent fifth low-voltage copper bars 179 to prevent leakage or short-circuit between adjacent fifth low-voltage copper bars 179.

Referring to FIG. 1, the power boost and conversion system further includes a first high-voltage output terminal 1011 and a second high-voltage output terminal 1012 arranged outside the cabinet. The first high-voltage output terminal 1011 includes a first high-voltage positive interface 1041, a first high-voltage negative interface 1042, and a first high-voltage ground interface 1043, and the second high-voltage output terminal 1012 includes a second high-voltage positive interface 1044, a second high-voltage negative interface 1045, and a second high-voltage ground interface 1046. The first high-voltage output terminal 1011 is connected to the first converter arranged in the conversion portion 102 via a first set of high-voltage copper bars 189 passing through the control portion 101, and the second high-voltage output terminal 1012 is connected to the second converter arranged in the conversion portion 102 via a second set of high-voltage copper bars 189 passing through the control portion 101. In other words, the first high-voltage positive interface 1041, the first high-voltage negative interface 1042, the first high-voltage ground interface 1043, the second high-voltage positive interface 1044, the second high-voltage negative interface 1045, and the second high-voltage ground interface 1046 are respectively connected to the first converter or the second converter via a plurality of high-voltage copper bars 189. In this way, the first converter and the second converter can respectively output high-voltage AC power via the first high-voltage output terminal 1011 and the second high-voltage output terminal 1012 outside the power boost and conversion system. Due to the fact that the first converter, the second converter, and the control circuit are all arranged in a same cabinet, the first converter and the second converter can directly output high voltage via the high-voltage copper bars 189 to the first high-voltage output terminal 1011 and the second high-voltage output terminal 1012 outside the power boost and conversion system. Compared with the design that converters are separated from the high-voltage box, the power boost and conversion system according to the present disclosure can reduce the number of the connection wire harnesses between the converters and the high-voltage lines, and the connection using the high-voltage copper bars 189 is more stable compared to the connection using harnesses. Therefore, not only the high integration, but also the reduced complexity of the power boost and conversion system can be achieved.

In some embodiments, the cross-sectional area of each of the high-voltage copper bars 189 is larger than the cross-sectional area of any of the copper bars used in the control circuit, for example, the first copper bar 119, the second copper bar 129, the third copper bar 139, the fourth copper bar 149, the first low-voltage copper bars 159, the second low-voltage copper bars 169, the third low-voltage copper bar, the fourth low-voltage copper bar, and the fifth low-voltage copper bars 179 used in the control circuit. Compared with the copper bars used in the control circuit, the high-voltage copper bars 189 needs to carry higher voltages or currents. Therefore, the cross-sectional area of each of the high-voltage copper bars 189 needs to be larger than the cross-sectional area of any of the copper bars used in the control circuit.

In some embodiments, a respective distance between every two adjacent high-voltage copper bars 189 is greater than or equal to 20 mm, for example 20 mm, 20.5 mm, 21 mm, 21.6 mm, 22 mm, 22.4 mm, or 23 mm, 23.6 mm, 24 mm, 24.4 mm, or 25 mm. There needs to be sufficient safety distance between adjacent high-voltage copper bars 189 to prevent leakage or short-circuit between adjacent high-voltage copper bars 189.

In some embodiments, the power boost and conversion system further includes a shielding cover (not shown) fixed to an inner wall of the cabinet to form, together with the inner wall of the cabinet, a shielding space, and the first set of high-voltage copper bars and the second set of high-voltage copper bars are arranged in the shielding space. The shielding cover can isolate the first and second sets of high-voltage copper bars from other elements in the control portion, thereby preventing mutual interference between the first and second sets of high-voltage copper bars and other elements in the control portion, and improving the stability during usage of the power boost and conversion system.

Referring to FIGS. 2 and 3, in some embodiments, a wire hole 113 is defined on the partition plate 103, and a protective layer 123 is provided on the periphery of the wire hole 113. The elements in the control portion 101 may also be connected with the elements in the conversion portion 102 by wire harnesses, in this way, the cost of copper bars can be reduced. By providing the protective layer 123 on the periphery of the wire hole 113, the wire harnesses can be prevented from being cut by the wire hole 113 on the partition plate 103, thereby improving the stability during usage of the power boost and conversion system.

Referring to FIGS. 3 and 8, the power boost and conversion system may further include a heat dissipation frame 201 arranged in the control portion 101 and a first fan (not shown) and a second fan (not shown) arranged inside the heat dissipation frame 201. A first ventilation hole 202 and a second ventilation hole 203 are defined on the heat dissipation frame 201, the first fan blows air towards the first circuit breaker 114 and the second circuit breaker 124 through the first ventilation hole 202, and the second fan blows air towards the first relay 116, the second relay 126, the third relay 136, and the fourth relay 146 through the second ventilation hole 203. By arranging the first fan and the second fan at lower positions in the heat dissipation frame 201 to respectively blows air towards the first circuit breaker 114 and the second circuit breaker 124 and the first to fourth relays 116 to 146, heat dissipation for the elements in the control circuit can be achieved, and the first fan and the second fan can enhance flowing of air in the control portion 101, thereby preventing the problem that heat generated by the elements in the control circuit is unable to dissipate, and improving the stability during usage of the power boost and conversion system.

In some embodiments, a wiring channel is formed by the spacing between the first and second frame and the heat dissipation frame 201, and the position of the wire hole 113 is in correspondence to the wiring channel. In this way, the wire harnesses between the control portion 101 and the conversion portion 102 can be routed by means of the wiring channel to prevent bending and winding of the wire harnesses, thereby reducing the complexity of layout of the wire harnesses in the power boost and conversion system.

Referring to FIG. 3, in some embodiments, the power boost and conversion system further includes a fan battery 204 arranged inside the heat dissipation frame 201, and the fan battery 204 is configured to supply power to the first fan and the second fan. In this way, the first fan, the second fan, and the fan battery 204 can be prevented from occupying excessive space in the control portion, which is conducive to providing more space for other elements in the control portion 101, thereby improving the utilization factor of space in the power boost and conversion system.

Referring to FIG. 8, the power boost and conversion system further includes a first battery management system 211, a second battery management system 212, and a fixing column 213. The fixing column 213 has a first fixing part, a second fixing part, and a limiting part, the first fixing part and the second fixing part are respectively arranged at ends of the fixing column, and the limiting part is arranged between the first fixing part and the second fixing part. The first fixing part is configured to fix the second battery management system 212 to a top of the heat dissipation frame 201, the second fixing part is configured to fix the first battery management system 211 above the second battery management system 212, and the limiting part is arranged between the first battery management system 211 and the second battery management system 212. In this way, the first battery management system 211 and the second battery management system 212 are arranged above the first fan and the second fan by means of the heat dissipation frame, the utilization factor of space in the control portion 101 can be further improved, thereby increasing the integration density of the power boost and conversion system. The first battery management system 211 and the second battery management system 212 are arranged on the heat dissipation frame 201 by the fixing column 213 and are arranged to separate vertically from each other. In this way, the space above the heat dissipation frame 201 can be fully utilized, and a safe distance between the first battery management system 211 and the second battery management system 212 can be maintained. The distance between the first battery management system 211 and the second battery management system 212 not only prevents mutual interference between them, but also facilitates the heat dissipation of the first battery management system 211 and the second battery management system 212.

In some embodiments, the power boost and conversion system further includes a third fan arranged inside the heat dissipation frame, a third ventilation hole is defined on a top surface of the heat dissipation frame, and the third fan blows air towards the first battery management system and the second battery management system through the third ventilation hole. The third fan arranged inside the heat dissipation frame can dissipate heat from the first battery management system and the second battery management system and occupies no space outside the heat dissipation frame, which is conducive to the high integration of the power boost and conversion system.

In some embodiments, the material of the heat dissipation frame 201 is either a metallic material or a non-metallic material. Metallic materials can improve the thermal conductivity of the heat dissipation frame 201, thereby facilitating the dissipation of heat by the heat dissipation frame 201. Additionally, metallic materials have high mechanical strength, which can provide sufficient support force to the first battery management system 211 and the second battery management system 212. Non-metallic materials can prevent conductivity between the first and second battery management systems and the heat dissipation frame 201, thereby improving the stability during usage of the power boost and conversion system.

In some embodiments, the power boost and conversion system further includes a pre-charge resistor 220 arranged in the control portion 101 and on a side wall of the heat dissipation frame 201. In this way, the pre-charge resistor 220 can be arranged along the vertical direction, thereby fully utilizing the space on the side wall of the heat dissipation frame 201, and improving the integration density of the power boost and conversion system.

The drawings of the present disclosure show that in a blowing direction of the first fan, the first relay 116, the second relay 126, the third relay 136, and the fourth relay 146 are arranged to align with each other. In some embodiments, in the blowing direction of the first fan, the first fan, the first relay 116, the second relay 126, the third relay 136, and the fourth relay 146 may be arranged to misalign with each other. In this way, the relay closest to the first fan can be prevented from blocking other relays, thereby enabling the heat generated by other relays to be carried away by the air blew by the first fan. The misaligning arrangement is at least conducive to changing the flow path of the air blew by the first fan, so that each relay can benefit from the air blew by the first fan for heat dissipation.

In some embodiments, each fifth low-voltage copper bar of the fifth low-voltage copper bars 179 may include a respective main body and a respective bended portion bended from the respective main body by a predetermined angle. In this way, the surface areas of the fifth low-voltage copper bars 179 can be increased, thereby increasing the areas for heat dissipation, which is conducive to the heat dissipation of the first relay 116, the second relay 126, the third relay 136, and the fourth relay 146 by means of the fifth low-voltage copper bars.

In some embodiments, the respective bended portion may be formed by bending or twisting.

In some embodiments, the respective bended portion may face to the blowing direction of the first fan. In this way, the respective bended portion has a relatively large windward area relative to the air flow blew by the first fan, which is conducive to improvement of the efficiency of heat dissipation of the fifth low-voltage copper bars.

In some embodiments, the power boost and conversion system further includes a plurality of air deflectors (not shown) arranged at intervals and on both sides of the first relay, the second relay, the third relay, and the fourth relay, and each air deflector of the plurality of air deflectors is at a predetermined angle to the blowing direction of the first fan. The plurality of air deflectors can direct the air flow blew by the first fan to the relays, which is conducive to improvement of the effect of heat dissipation for the relays.

In some embodiments, a plurality of heat-dissipation through holes (not shown) are defined on the partition plate, and an exhaust fan (not shown) is provided on a side of the partition plate facing the conversion portion. The exhaust fan can draw heat from the control portion to the conversion portion, thereby further dissipating the heat in the control portion, preventing failure of the elements in the control portion due to too high temperature in the control portion, and improving the stability during usage of the power boost and conversion system.

In some embodiments, at least one liquid cooling module (not shown) is provided in the conversion portion and is arranged to face to the blowing direction of the exhaust fan. On the one hand, the at least one liquid cooling module in the conversion portion can cool down the first converter and the second converter. On the other hand, the blowing direction of the exhaust fan directs to the at least one liquid cooling module, which can transfer the heat from the control portion to the at least one liquid cooling module for cooling by the exhaust fan. In this way, the temperature in both the control portion and the conversion portion of the power boost and conversion system can be kept at a relatively low operating condition.

Embodiments of the present disclosure provide a power boost and conversion system. The power boost and conversion system includes a cabinet including a control portion 101, a conversion portion 102, and a partition plate 103 arranged between the control portion 101 and the conversion portion 102. The control portion 101 is configured to accommodate a control circuit, and the conversion portion 102 is configured to accommodate a first converter and a second converter. By integrating PCS and the elements in the high-voltage box into a same cabinet, the space occupied by PCS and the high-voltage box in the energy storage system can be reduced, and the standard costs of raw materials, components, tools, and labor required in the manufacturing process of the energy storage system can be significantly reduced. Moreover, the difficulty in external wiring and the complexity of system can also be reduced, thereby reducing the number of DC cables, eliminating potential fault points, and improving the reliability of the system. By separating the control portion 101 from the conversion portion 102 using the partition plate 103, the problem of interference between the control circuit in the control portion 101 and the PCS in the conversion portion 102 can be prevented, thereby improving the stability of the power boost and conversion system during usage. Furthermore, in the control portion 101 of the cabinet, the first circuit breaker 114, the second circuit breaker 124, the first fuse 115, the second fuse 125, the first relay 116, the second relay 126, the third relay 136, and the fourth relay 146 in the control circuit form two high-voltage control circuits being respectively connected to the first converter and the second converter. In this way, PCS is highly integrated with the high-voltage box, thereby further improving the integration density of the power boost and conversion system, allowing one power boost and conversion system to be in connection with two battery modules. The first circuit breaker 114 is arranged above the second circuit breaker 124 by means of the first frame 108, and the first fuse 115 and the second fuse 125 are arranged above the first relay 116, the second relay 126, the third relay 136, and the fourth relay 146 by means of the second frame 105. In this way, not only the high integration, but also the safe distances between various elements in the control circuit can be ensured, thereby preventing mutual interference between electrical elements and improving the reliability and safety of the power boost and conversion system.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure. Therefore, the patent scope of protection of the present disclosure shall still be subject to the scope limited by the appended claims.

What is claimed is:

1. A power boost and conversion system, comprising:

a cabinet including a control portion, a conversion portion, and a partition plate arranged between the control portion and the conversion portion, wherein the control portion is configured to accommodate a control circuit, and the conversion portion is configured to accommodate a first converter and a second converter, and wherein the control circuit includes a first circuit breaker and a second circuit breaker; and a first frame including a first riser and a first cross plate, wherein a bottom end of the first riser is fixed to an inner bottom surface of the cabinet, a top end of the first riser is fixed to an end of the first cross plate, and an other end of the first cross plate is fixed to an inner wall of the cabinet, and wherein the first circuit breaker and the second circuit breaker are fixed to the first riser, and the first circuit breaker is arranged to be closer to the top end of the first riser than the second circuit breaker;

wherein a positive input terminal and a negative input terminal of the first circuit breaker are respectively connected to a first battery positive interface and a first battery negative interface outside the cabinet; and wherein a positive input terminal and a negative input terminal of the second circuit breaker are respectively connected to a second battery positive interface and a second battery negative interface outside the cabinet.

2. The power boost and conversion system according to claim 1, wherein the first frame further includes a bottom plate fixed to the inner bottom surface of the cabinet, wherein the bottom end of the first riser is fixed to an end of the bottom plate, and the second circuit breaker is arranged on the bottom plate to separate the second circuit breaker from the inner bottom surface of the cabinet.

3. The power boost and conversion system according to claim 1, wherein in a vertical direction, the first circuit breaker is arranged to separate from the second circuit breaker by a distance ranged from 10 mm to 15 mm.

4. The power boost and conversion system according to claim 1, wherein the control circuit further includes a first fuse, a second fuse, a first relay, a second relay, a third relay, and a fourth relay;

wherein a positive output terminal of the first circuit breaker is connected to the first converter via the first fuse and the first relay connected in series, and a negative output terminal of the first circuit breaker is connected in series to the first converter via the second relay; and wherein a positive output terminal of the second circuit breaker is connected to the second converter via the second fuse and the third relay connected in series, and a negative output terminal of the second circuit breaker is connected in series to the second converter via the fourth relay.

5. The power boost and conversion system according to claim 4, further including a second frame including second risers and a second cross plate, wherein a respective bottom end of each second riser of the second risers is fixed to the inner bottom surface of the cabinet, a respective top end of each second riser of the second risers is fixed to an end of the second cross plate, and an other end of the second cross plate is fixed to an inner wall of the cabinet, and wherein the first fuse and the second fuse are fixed on the second cross plate, and the first relay, the second relay, the third relay, and the fourth relay are arranged below the second cross plate.

6. The power boost and conversion system according to claim 1, wherein the positive input terminal of the first circuit breaker is connected to the first battery positive interface via a first copper bar, and the positive input terminal of the second circuit breaker is connected to the second battery positive interface via a second copper bar;

wherein the control circuit further includes a first Hall element passed through by the first copper bar and a second Hall element passed through by the second copper bar; and wherein the power boost and conversion system further includes a third frame including a support portion fixed to an inner wall of the cabinet and a protruding portion protruding from the support portion, and the first Hall element and the second Hall element are fixed on the protruding portion and are arranged to separate from each other in a vertical direction.

7. The power boost and conversion system according to claim 6, wherein the negative input terminal of the first circuit breaker is connected to the first battery negative interface via a third copper bar, the negative input terminal of the second circuit breaker is connected to the second battery negative interface via a fourth copper bar, and the third copper bar, the first copper bar, the fourth copper bar, and the second copper bar are arranged in sequence along the vertical direction; and wherein a shielding layer is arranged on a surface of the fourth copper bar and arranged between the first Hall element and the second Hall element.

8. The power boost and conversion system according to claim 1, wherein a plurality of heat-dissipation through holes are defined on the partition plate, and an exhaust fan is provided on a side of the partition plate facing the conversion portion.

9. The power boost and conversion system according to claim 8, further including a liquid cooling module arranged in the conversion portion, wherein an outlet direction of the exhaust fan directs towards the liquid cooling module.

10. The power boost and conversion system according to claim 1, further including a first high-voltage output terminal and a second high-voltage output terminal arranged outside the cabinet;

wherein the first high-voltage output terminal includes a first high-voltage positive interface, a first high-voltage negative interface, and a first high-voltage ground interface, and the second high-voltage output terminal includes a second high-voltage positive interface, a second high-voltage negative interface, and a second high-voltage ground interface;

wherein the first high-voltage output terminal is connected to the first converter arranged in the conversion portion via a first set of high-voltage copper bars, and the second high-voltage output terminal is connected to the second converter arranged in the conversion portion via a second set of high-voltage copper bars; and wherein the power boost and conversion system further includes a shielding cover fixed to an inner wall of the cabinet to form a shielding space, and the first set of high-voltage copper bars and the second set of high-voltage copper bars are arranged in the shielding space.

11. The power boost and conversion system according to claim 5, wherein two ends of the first fuse are respectively connected to the positive output terminal of the first circuit breaker and to the first relay via first low-voltage copper bars, and the first low-voltage copper bars are fixed to the second cross plate via insulation columns to leave a spacing between the first fuse and the second cross plate; and wherein two ends of the second fuse are respectively connected to the positive output terminal of the second circuit breaker and to the third relay via second low-voltage copper bars, and the second low-voltage copper bars are fixed to the second cross plate via insulation columns to leave a spacing between the second fuse and the second cross plate.

12. The power boost and conversion system according to claim 5, further including a heat dissipation frame arranged in the control portion and a first fan and a second fan arranged inside the heat dissipation frame;

wherein a first ventilation hole and a second ventilation hole are defined on the heat dissipation frame, the first fan blows air towards the first circuit breaker and the second circuit breaker through the first ventilation hole, and the second fan blows air towards the first relay, the second relay, the third relay, and the fourth relay through the second ventilation hole.

13. The power boost and conversion system according to claim 12, further including a first battery management system, a second battery management system, and a fixing column;

wherein the fixing column has a first fixing part, a second fixing part, and a limiting part, the first fixing part and the second fixing part are respectively arranged at ends of the fixing column, and the limiting part is arranged between the first fixing part and the second fixing part; and wherein the first fixing part is configured to fix the second battery management system to a top of the heat dissipation frame, the second fixing part is configured to fix the first battery management system above the second battery management system, and the limiting part is arranged between the first battery management system and the second battery management system.

14. The power boost and conversion system according to claim 13, further including a third fan arranged inside the heat dissipation frame, a third ventilation hole is defined on a top surface of the heat dissipation frame, and the third fan blows air towards the first battery management system and the second battery management system through the third ventilation hole.

15. The power boost and conversion system according to claim 12, further including a fan battery arranged inside the heat dissipation frame, wherein the fan battery is configured to supply power to the first fan and the second fan.

16. The power boost and conversion system according to claim 12, further including a pre-charge resistor arranged in the control portion and on a side wall of the heat dissipation frame.

17. The power boost and conversion system according to claim 12, wherein in a blowing direction of the first fan, the first relay, the second relay, the third relay, and the fourth relay are arranged to misalign with each other.

18. The power boost and conversion system according to claim 11, wherein the negative output terminal of the first circuit breaker is connected to the second relay via a third low-voltage copper bar, the negative output terminal of the second circuit breaker is connected to the fourth relay via a fourth low-voltage copper bar, and a respective distance between every two of one respective first low-voltage copper bar of the first low-voltage copper bars, one respective second low-voltage copper bar of the second low-voltage copper bars, the third low-voltage copper bar, and the fourth low-voltage copper bar is greater than or equal to 10 mm.

19. The power boost and conversion system according to claim 18, wherein the first relay and the second relay are respectively connected to the first converter via at least some of fifth low-voltage copper bars, the third relay and the fourth relay are respectively connected to the second converter via at least some of the fifth low-voltage copper bars, and each fifth low-voltage copper bar of the fifth low-voltage copper bars includes a respective main body and a respective bended portion bended from the respective main body by a predetermined angle.

20. The power boost and conversion system according to claim 12, further including a plurality of air deflectors arranged at intervals and on both sides of the first relay, the second relay, the third relay, and the fourth relay, and each air deflector of the plurality of air deflectors is at a predetermined angle to a blowing direction of the first fan.

* * * * *